(12) United States Patent
Gambino et al.

(10) Patent No.: US 6,762,108 B2
(45) Date of Patent: Jul. 13, 2004

(54) METHOD OF FORMING A METAL-INSULATOR-METAL CAPACITOR FOR DUAL DAMASCENE INTERCONNECT PROCESSING AND THE DEVICE SO FORMED

(75) Inventors: Jeffrey P. Gambino, Westford, VT (US); Stephen E. Luce, Underhill, VT (US); Thomas L. McDevitt, Underhill, VT (US); Henry W. Trombley, Starksboro, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/260,613

(22) Filed: Sep. 27, 2002

(65) Prior Publication Data

US 2003/0025139 A1 Feb. 6, 2003

Related U.S. Application Data

(62) Division of application No. 09/681,197, filed on Feb. 16, 2001, now Pat. No. 6,504,203.

(51) Int. Cl.$^7$ .............................................. H01L 21/20
(52) U.S. Cl. ..................... 438/396; 438/957; 438/240; 438/253
(58) Field of Search ............................... 438/396, 957, 438/240, 253

(56) References Cited

U.S. PATENT DOCUMENTS

| | | | |
|---|---|---|---|
| 4,423,087 A | | 12/1983 | Howard et al. |
| 5,350,705 A | * | 9/1994 | Brassington et al. ....... 257/295 |
| 5,371,700 A | | 12/1994 | Hamada |
| 5,442,213 A | | 8/1995 | Okudaira et al. |
| 5,674,771 A | | 10/1997 | Machida et al. |
| 5,926,359 A | | 7/1999 | Greco et al. |
| 6,399,974 B1 | * | 6/2002 | Ohtsuki ....................... 257/296 |
| 6,559,499 B1 | * | 5/2003 | Alers et al. ................... 257/311 |

* cited by examiner

Primary Examiner—Aivir Zarabian
Assistant Examiner—Christy Novacek
(74) Attorney, Agent, or Firm—Schmeiser, Olsen & Watts; William D. Sabo

(57) ABSTRACT

The present invention provides a method of forming a capacitor in a last metal wiring layer, and the structure so formed. The invention further provides a spacer formed around the capacitor to electrically isolate portions of the capacitor.

13 Claims, 5 Drawing Sheets

METHOD OF FORMING A METAL-INSULATOR-METAL CAPACITOR FOR DUAL DAMASCENE INTERCONNECT PROCESSING AND THE DEVICE SO FORMED

This application is a divisional of Ser. No. 09/681,197 filed on Feb. 16, 2001, now U.S. Pat. No. 6,504,203.

BACKGROUND OF THE INVENTION

1. Technical Field

The present invention relates generally to semiconductor processing, and more particularly, to the formation of a capacitor and the capacitor so formed.

2. Related Art

A conventional method of producing a metal-insulator-metal capacitor using dual damascene processing is illustrated in related art FIGS. 1–5. In particular, FIG. 1 shows a structure 10 comprising a first metal wiring layer 11 and a second metal wiring layer 13. The first metal wiring layer 11 includes an insulative layer 12 having a first via 16 and a pair of first metal lines 18 formed therein. The second metal wiring layer 13 includes an insulative layer 14 having a plurality of second vias 20 and a second metal line 22 formed therein.

A capping layer 24, such as SiN, is deposited over the surface of the second metal wiring layer 13 to prevent the material within the second metal line 22 (typically copper), from oxidizing. A first mask (not shown) is used to pattern and etch an opening 26 within the capping layer 24 to expose the second vias 20 in the region where the capacitor is to be formed.

As shown in FIG. 2, a capacitor stack 28, comprising a first electrode layer 30, a dielectric layer 32 and a second electrode layer 34, is deposited over the surface of the second metal wiring layer 13. A second mask (not shown) is deposited over the capacitor stack 28 to pattern and etch the stack 28 as illustrated in FIG. 3. Following removal of the second mask, a third metal wiring layer 35 may be formed over the second metal wiring layer 13 by depositing an insulative layer 36, such as SiO2, over the structure 10 and planarizing the insulative layer 36. Thereafter, a plurality of third vias 38 and third metal lines 40 are formed in the insulative layer 36, as shown in FIG. 4.

However, there are several disadvantages associated with this method. For instance, because the second vias 20 and second metal lines 22 are typically formed of copper, which cannot be wire bonded, an additional metal wiring layer 35, having aluminum vias 38 and metal lines 40, must be formed over the capacitor stack 28 to make electrical connection.

The use of copper within the second vias 20 and second metal lines 22 also necessitates the use of a capping layer to prevent oxidation, as well as an additional masking step to form the capacitor stack opening in the capping layer 24. This creates additional steps which increase manufacturing time and costs.

Also, because the copper within the second metal line 22 and second vias 20 has a faster polish rate than the insulating material of the insulative layer 14, i.e., $SiO_2$, "dishing" may occur. In other words, during a polishing step used to remove excess copper deposited to form the metal line 22 and vias 20, a portion of the exposed metal line 22 and second vias 20 is removed below the surface of the metal wiring layer 13, e.g., about 100–500 Å, (FIG. 5). This creates corners 42 which are replicated in subsequent layers, e.g., the capping layer 24 and the capacitor stack 28. The thickness of the layers of the capacitor (30, 32, 34) will be reduced over the corners, particularly along the vertical sidewalls of the capacitor stack 28, and therefore, are more likely to cause device failures due to shorting.

In addition, the third vias 38 are simultaneously etched within the insulative layer 36. As illustrated in FIG. 4, the vias 38 over the capacitor 28 need to be etched to a depth less than that of the other vias 38. Therefore, the vias 38 and capacitor 28 are exposed a prolonged overetch. As a result, the capacitor 28 may be penetrated by the extended overetch, causing the capacitor 28 to be shorted out or damaged.

Furthermore, an additional step is required to planarize the material forming the third metal wiring layer 35 following deposition of the insulative layer 36 (typically, $SiO_2$) because the capacitor stack 28 extends vertically above the capping layer 24, forming a bump or high spot within the insulative layer 36.

Therefore, there exists a need in the industry for a method of producing a metal-insulator-metal capacitor, using dual damascene processing, that overcomes these and other problems.

SUMMARY OF THE INVENTION

A first general aspect of the present invention provides a capacitor for a semiconductor device, comprising: a first and a second conductive element formed within a first insulative layer; a first conductive plate formed over the first conductive element; a second insulative layer formed over the first conductive plate; a second conductive plate formed over the second insulative layer; and a conductive layer electrically connecting the second conductive plate and the second conductive element.

A second general aspect of the present invention provides a semiconductor device, comprising: a first and a second conductive element formed within a first insulative layer; a capacitor formed over the first conductive element; a spacer formed around the capacitor; and a conductive layer electrically connecting the capacitor and the second conductive element.

A third general aspect of the present invention provides a method of forming a capacitor for a semiconductor device, comprising: forming at least a first and a second conductive element within an insulative layer; forming a capacitor over the first conductive element; forming a spacer around the capacitor; and forming a conductive layer electrically connecting the capacitor to the second conductive element.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 6:
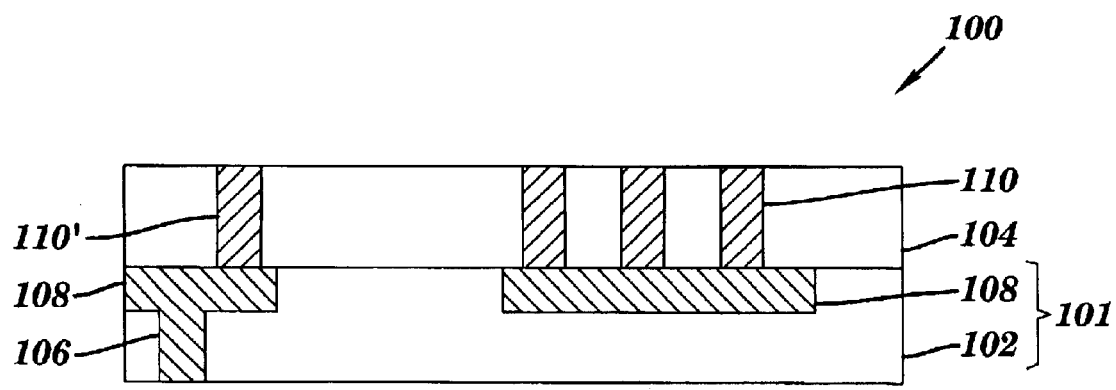
FIG. 6 depicts a structure in accordance with the present invention.

Referring to the drawings, FIG. 6 shows a semiconductor device or structure 100 including a first metal wiring layer 101 formed using conventional semiconductor processing techniques. For instance, the first metal wiring layer 101 includes an insulative layer 102, comprising $SiO_2$, or other similarly used material, having a first conductive element or via 106 and a pair of first conductive or metal lines 108 formed therein. The via 106 is patterned using photolithographic, or other similar processes, and etched using a reactive ion etch (RIE), or other similar process. Likewise, the metal lines 108 are patterned using photolithographic, or other similar processes, and etched using a reactive ion etch (RIE), or other similar process. Thereafter, a conductive material, such as W, Al, Ti, TiN, etc., is deposited, using physical vapor deposition (PVD), chemical vapor deposition (CVD), etc., over the surface of the metal wiring layer 101, filling the vias 106 and the metal lines 108. The surface of the metal wiring layer 101 is then planarized, using a conventional polishing process, to remove excess conductive material on the surface of the metal wiring layer 101.

A layer of insulative material 104, such as $SiO_2$, or other similarly used material, is then deposited over the surface of the first metal wiring layer 101. A plurality of second conductive elements or vias 110 and 110' are formed in the insulative layer 104 in a similar manner as the vias 106 in the first metal wiring layer 101, (wherein the vias 110, in this example three vias 110, are formed in a region of the structure 100 beneath the capacitor, described and formed infra, and the vias 110' are formed in a region of the structure 100 separated from the capacitor). For instance, the vias 110, 110' are patterned using photolithographic, or other similar processes and etched to approximately the same depth using a RIE, or other similar etching process. Thereafter, a conductive material, such as W, Al, Ti, TiN, etc., is deposited, using PVD, CVD, etc., over the surface of the insulative layer 104, filling the vias 110, 110'. The surface of the insulative layer 104 is then planarized, using conventional polishing processes, to remove excess conductive material on the surface of the layer 104.

Figure 7:
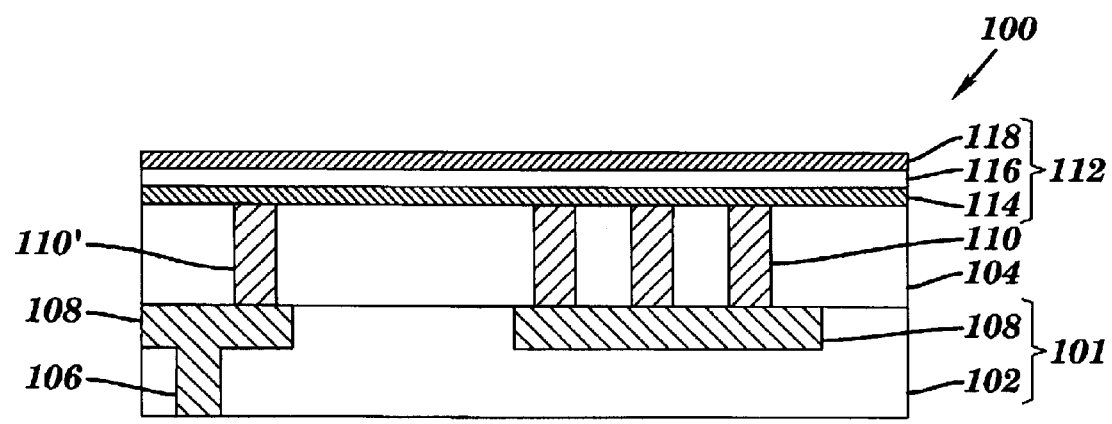
FIG. 7 depicts the structure of FIG. 6 having a capacitor stack deposited thereover in accordance with the present invention.

As illustrated in FIG. 7, a capacitor stack 112 is deposited over the surface of the insulative layer 104, using PVD, CVD, or other similar deposition technique. The capacitor stack 112 comprises a first electrode layer 114, a dielectric layer 116 and a second electrode layer 118. The first and second electrode layers 114, 118, or electrically conductive plates, are each deposited having a thickness in the range of approximately 10–200 nm, e.g., 100 nm, and comprise TiN, Ti, Ta, TaN, Pt, Al, or other similar material. The dielectric layer 116, or electrically insulative layer, is deposited having a thickness in the range of approximately 5–50 nm, e.g., 10 nm, and comprises $SiO_2$, $Si_3N_4$, $Ta_2O_5$, $BaSrTiO_3$, $ZrO_2$, $HfO_2$, $TiO_2$ or other similar material.

Figure 8:
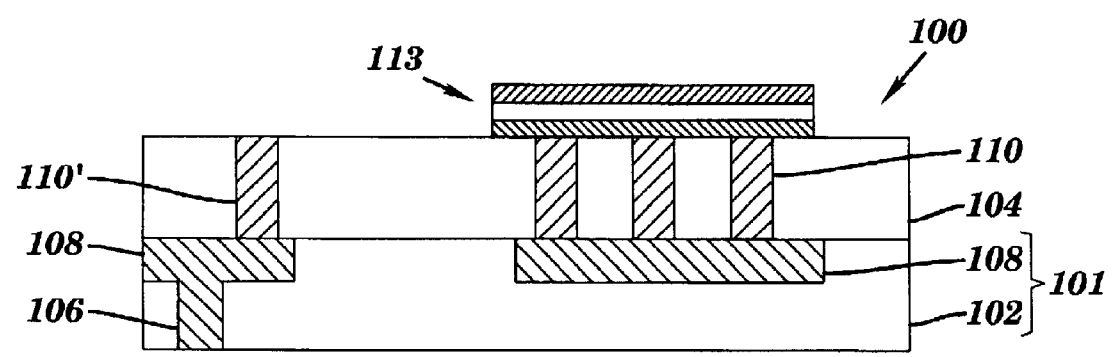
FIG. 8 depicts the structure of FIG. 7 following patterning and etching of the capacitor stack in accordance with the present invention.

As illustrated in FIG. 8, the capacitor stack 112 is patterned, using a lithographic or other similar process, and etched, using a RIE or other similar process, to form a capacitor 113. For instance, an F-based (fluorine based) RIE, Cl-based (chlorine based) RIE, or other similar etch may be used to etch the first and second electrode layers 114, 118, and an F-based RIE, or other similar etch, may be used to etch the dielectric layer 116.

Figure 9:
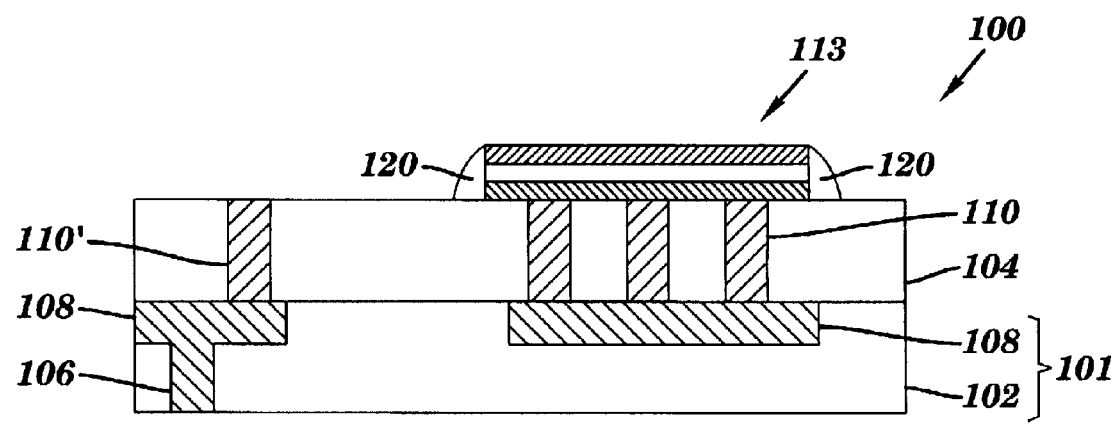
FIG. 9 depicts the structure of FIG. 8 having a spacer formed around the capacitor stack in accordance with the present invention.

As shown in FIG. 9, a spacer 120 is formed around the perimeter of the capacitor 113. For example, an insulating material, such as $SiO_2$, $Si_3N_4$, etc., is deposited over the surface of the structure 100 using plasma enhanced chemical vapor deposition (PECVD), or other similar process. The spacer material is deposited having a thickness in the range of approximately 20–200 nm, e.g., 100 nm. Thereafter, the spacer material is etched, using an F-based RIE, or other similar etching process, to form the spacer 120 covering the vertical walls of the capacitor 113.

Figure 10:
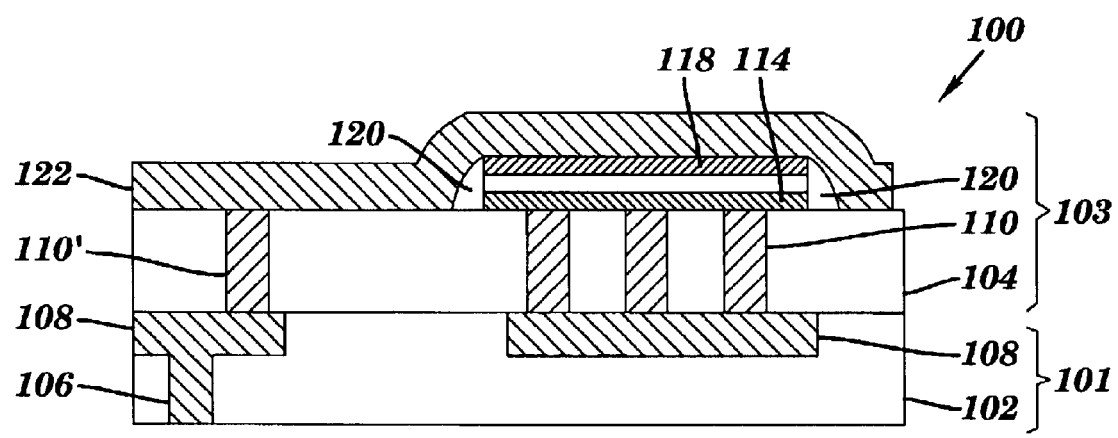
FIG. 10 depicts the structure of FIG. 9 having a conductive layer formed thereover in accordance with the present invention.

As illustrated in FIG. 10, a conductive layer or second metal line 122, such as Al, W, Au, silver, or other similar material, is formed over the capacitor 113, the spacer 120 and the surface of the second insulative layer 104, such that electrical contact is made between the second electrode layer 118 and the second via 110', thereby forming a second metal wiring layer 103. For instance, the second metal line 122 is deposited having a thickness in the range of approximately 10–200 nm, e.g., 500 nm, over the surface of the structure 100. Thereafter, the second metal line 122 is patterned, using a lithographic or other similar process, and etched, using RIE, or other similar process.

The second metal line 122 is formed to electrically connect the vias 106, 110' and first metal line 108 to the second electrode layer 118 of the capacitor 113. Contact with the first electrode layer 114, however, would produce a short. Therefore, the spacer 120 prevents the second metal line 122 from contacting the first electrode layer 114.

By forming the capacitor stack 112 in the last metal wiring layer 103, the present invention overcomes many of the problems associated with the related art. For instance, because the vias 106, 110, 110' and the metal lines 108, 122 are formed of a material that does not oxidize when exposed to air, unlike the copper used in the related art, there is no need for a capping layer. Elimination of the capping layer also eradicates the need for the additional masking step required to pattern and etch an opening within the capping layer prior to the formation of the capacitor.

Additionally, because the second metal line 122 is formed on top of the capacitor 113, the need to form the third metal wiring layer 35, containing the vias 38 and metal lines 40 necessary to form an electrical connection between the vias 16, 20, 38 and metal lines 18, 24, 40 of the second metal wiring layer 13 and the capacitor 28 (FIG. 4), is eliminated. As a result, the added step of depositing the third metal wiring layer 35, and planarizing the third metal wiring layer 35 over the capacitor 28, is no longer needed. Also, because the via 110' is formed of tungsten or aluminum, rather than copper, the via 110' may be wire bonded to the second metal line 122 without forming an additional metal wiring layer.

Figure 1:
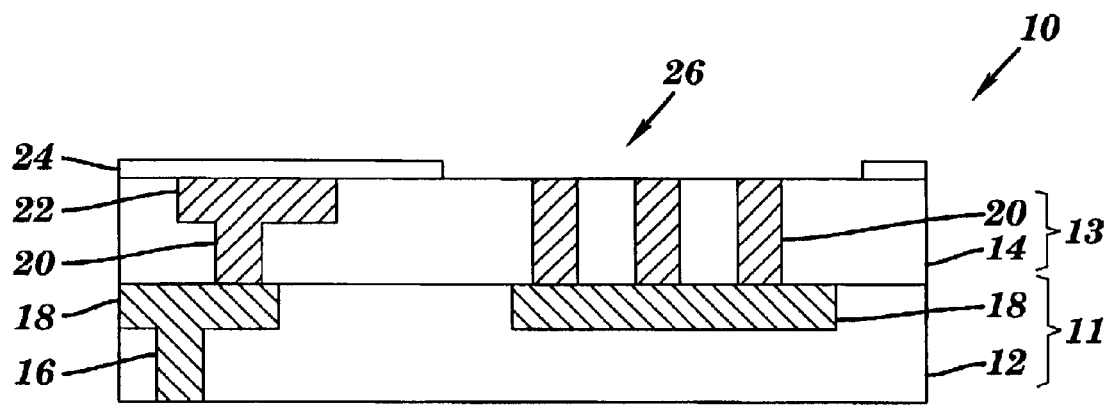
FIG. 1 depicts a related art structure having a capping layer thereon.
Figure 2:
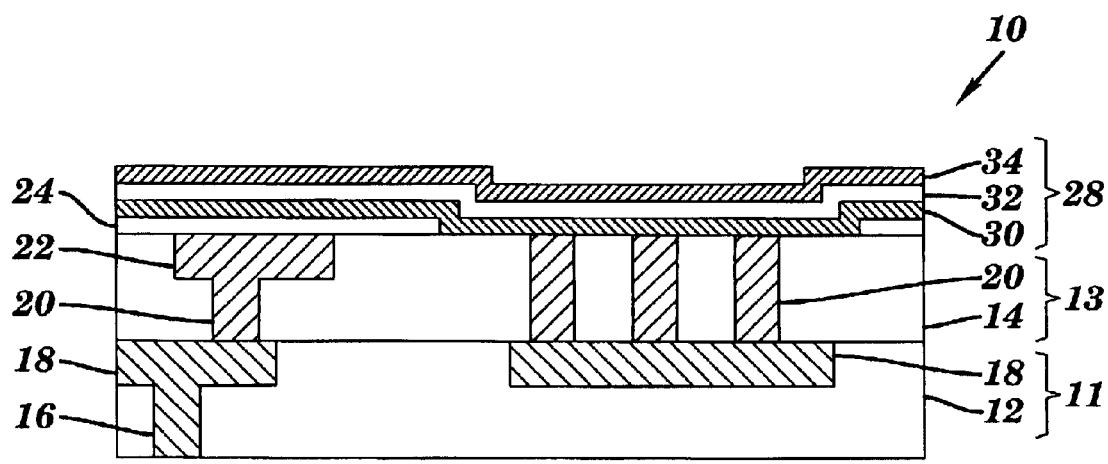
FIG. 2 depicts the related art structure of FIG. 1 having a capacitor stack thereon.
Figure 3:
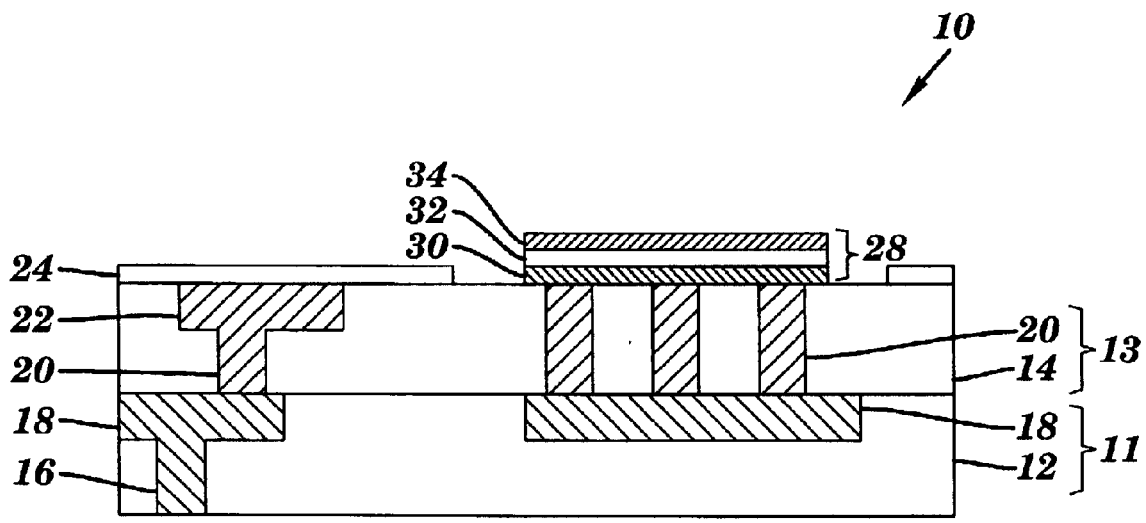
FIG. 3 depicts the related art structure of FIG. 2 following patterning and etching of the capacitor stack.
Figure 4:
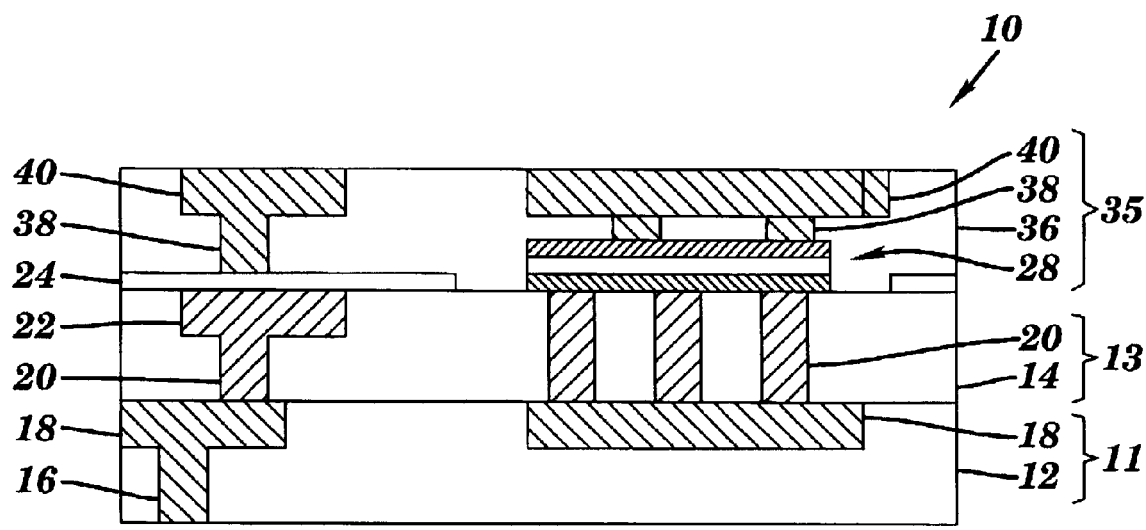
FIG. 4 depicts the related art structure of FIG. 3 having an additional metal wiring layer formed thereon.
Figure 5:
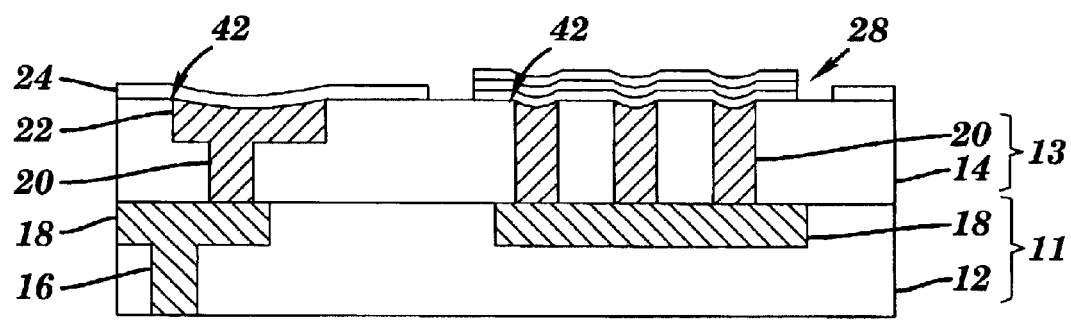
FIG. 5 depicts the related art structure of FIG. 3 illustrating a defect formed during processing.

Similarly, the related art problem associated with etching the third vias 38 and third metal lines 40 within the third metal wiring layer 35, is eliminated. Again, because the capacitor 113 is formed within the last metal wiring layer 103, the vias 110, 110' are formed at approximately the same depth. Accordingly, there is no need to form a third wiring layer 35, having third vias 38 which are to be etched at different depths (FIG. 4).

In addition, the related art problem of "dishing" is significantly minimized because the material used to form the vias 110, 110', e.g., tungsten, aluminum, etc., has a polish rate similar to that of the material in the insulative layer 104, unlike the related art copper. Therefore, the material within the vias 110, 110' is less likely to be overetched, and partially removed, during planarization.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of forming a capacitor for a semiconductor device, comprising:

forming at least a first and a second conductive element within an insulative layer, wherein a surface of the first conductive element and a surface of the second conductive element are each coplanar with a surface of the insulative layer;

forming a capacitor on, and in direct mechanical contact with, the surface of the insulative layer over the first conductive element;

forming a spacer around the capacitor; and forming a conductive layer electrically connecting the capacitor to the second conductive element, wherein the conductive layer is external to each plate of the capacitor.

2. The method of claim 1, wherein the spacer comprises a material selected from the group consisting of: $SiO_2$, $Si_3N_4$, $Ta_2O_5$, $BaSrTiO_3$, $ZrO_2$, $HFO_2$ and $TiO_2$.

3. The method of claim 1, wherein the first and second conductive elements comprise vias.

4. The method of claim 3, wherein the vias comprise a material selected from the group consisting of: W, Al, Ti and TiN.

5. The method of claim 1, wherein forming the capacitor further comprises:

depositing a first conductive plate formed over the first conductive element;

depositing a second insulative layer formed over the first conductive plate; and depositing a second conductive plate formed over the second insulative layer.

6. The method of claim 5, further comprising:

patterning the first and second conductive plates and the second insulative layer; and etching the first and second conductive plates and the second insulative layer.

7. The method of claim 5, wherein the first and second conductive plates comprise a material selected from the group consisting of: TiN, Ti, Ta, TaN, Pt and Al.

8. The method of claim 5, wherein the first and second conductive plates have a thickness in the range of approximately 10–200 nm.

9. The method of claim 5, wherein the second insulative layer comprises a material selected from the group consisting of: $SiO_2$, $Si_3N_4$, $Ta_2O_5$ and $BaSrTiO_3$.

10. The method of claim 5, wherein the second insulative layer has a thickness in the range of approximately 5–50 nm.

11. The method of claim 5, wherein the conductive layer comprises a material selected from the group consisting of: Al, W, Au and silver.

12. The method of claim 5, wherein the conductive layer has a thickness in the range of approximately 10–200 nm.

13. A method or forming a capacitor for a semiconductor device, comprising:

forming a conductive element within an insulative layer, wherein a surface of the conductive element is coplanar with a surface of the insulative layer;

forming a capacitor on, and in direct mechanical contact with, the surface of the insulative layer;

forming a spacer around the capacitor; and forming a conductive layer electrically connecting the capacitor to the conductive element, wherein the conductive layer is external to each plate of the capacitor.

* * * * *